(12) United States Patent
Chung

(10) Patent No.: US 7,327,018 B2
(45) Date of Patent: Feb. 5, 2008

(54) CHIP PACKAGE STRUCTURE, PACKAGE SUBSTRATE AND MANUFACTURING METHOD THEREOF

(75) Inventor: Chih-Ming Chung, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/163,276

(22) Filed: Oct. 12, 2005

(65) Prior Publication Data

US 2006/0076659 A1 Apr. 13, 2006

(30) Foreign Application Priority Data

Oct. 13, 2004 (TW) ............... 93130958 A

(51) Int. Cl.
*H01L 23/02* (2006.01)
(52) U.S. Cl. .............. 257/678; 257/786; 257/723; 257/720; 257/734; 257/690; 257/778; 257/698; 257/700; 257/701; 257/702
(58) Field of Classification Search ........... 257/678, 257/786, 723, 720, 734, 690
See application file for complete search history.

(56) References Cited

U.S. PATENT DOCUMENTS 6,743,661 B1 * 6/2004 Drewery ............... 438/110
6,952,049 B1 * 10/2005 Ogawa et al. ........... 257/700

* cited by examiner

*Primary Examiner*—Junghwa Im
(74) *Attorney, Agent, or Firm*—Jiang Chyun IP Office

(57) ABSTRACT

A package substrate for carrying a chip with a plurality of bumps thereon is provided. The package substrate includes a first substrate, and an interposer. The first substrate has a first circuit layer disposed on a surface thereof. The interposer includes a second substrate and a second circuit layer formed thereon. The second circuit layer comprises a plurality of bonding pads and traces. The traces are electrically connected to the corresponding bonding pads. Furthermore, the bonding pads are used for being connected to the bumps. The second circuit layer of the interposer is physically and electrically connected to the first circuit layer of the first substrate, and the second substrate and the first substrate are made of different materials.

9 Claims, 5 Drawing Sheets

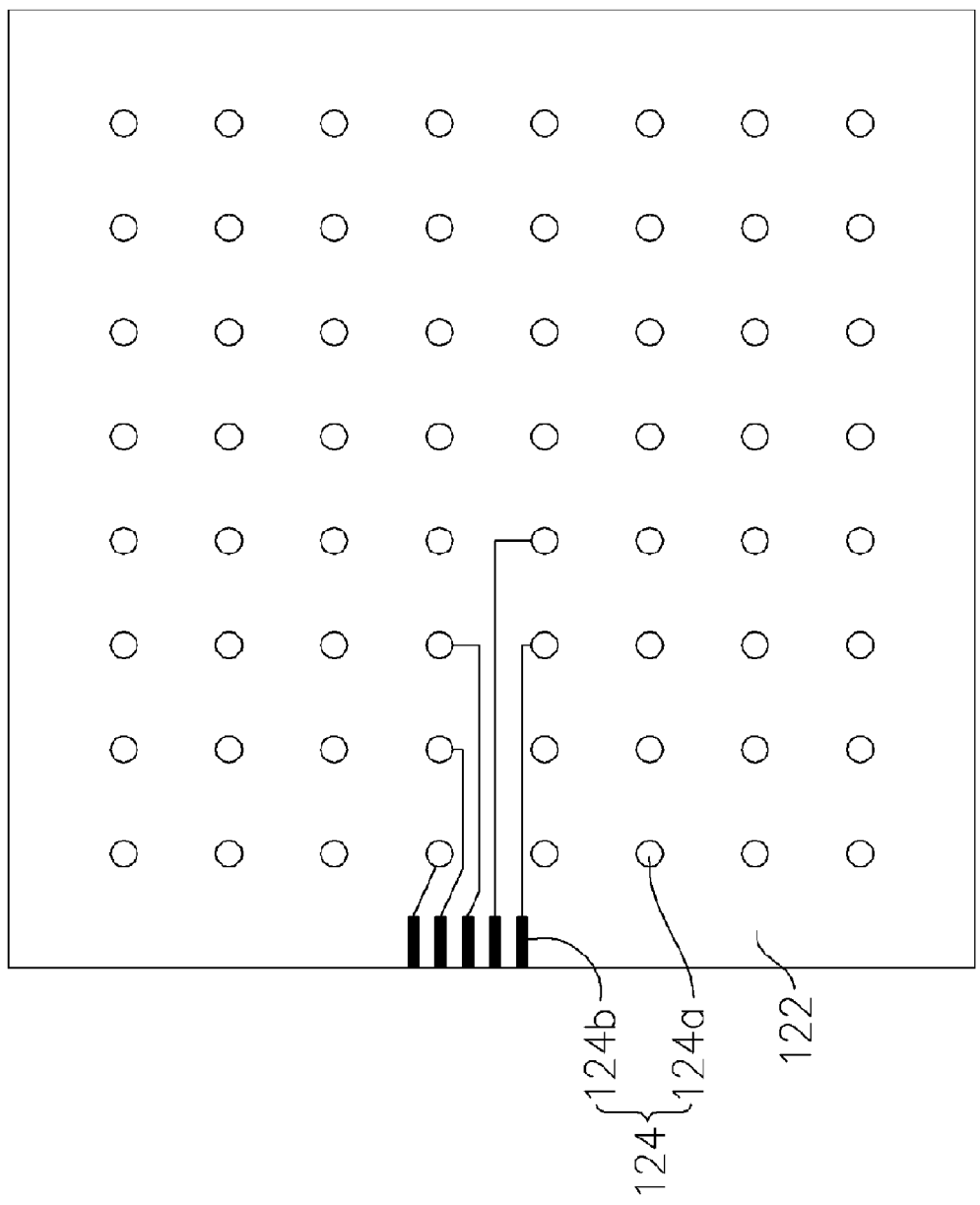

CHIP PACKAGE STRUCTURE, PACKAGE SUBSTRATE AND MANUFACTURING METHOD THEREOF

CROSS-REFERENCE TO RELATED APPLICATION

This application claims the priority benefit of Taiwan application serial no. 93130958, filed on Oct. 13, 2004. All disclosure of the Taiwan application is incorporated herein by reference.

BACKGROUND OF THE INVENTION

1. Field of the Invention

The present invention relates to a substrate and manufacturing method thereof. More particularly, the present invention relates to a flip chip package substrate and manufacturing method thereof.

2. Description of the Related Art

In the packaging process of integrated circuits (IC), the first level packaging mainly involves attaching chips onto carriers. The packaging formats include wire bonding (WB), tape automatic bonding (TAB) and flip chip (FC). Regardless of TAB or FC formats, in the process of attaching the chip onto the package substrate, bumps are fabricated on the bonding pads of a wafer so that the bumps can subsequently serve as an electrical connection between the chip and package substrate.

With the maturity of the fabricating technology of semiconductor devices, the pitch between the bumps on a chip has been shrinking. However, the fabricating technology of the package substrate can hardly keep up with that of the chips. At present, the smallest pitch between the bumps on a chip is down to about 120 microns. Yet, the pitch between bonding pads on a package substrate fabricated with the highest precision is at most 200 microns. Therefore, the current fabricating technology of the packaging substrate limits the bump pitch on a chip. Furthermore, as the pad pitch continues to reduce, the mismatch of the coefficient of thermal expansion between the chip and the package substrate often leads to increasing thermal stress and warpage between the two. Ultimately, the reliability of the connection between the chip and the package substrate declines. In addition, the cost of fabricating a package substrate with fine pad pitch is very high.

SUMMARY OF THE INVENTION

Accordingly, one object of the present invention is to provide a package substrate capable of relaxing the space limit of pitches between bumps on a chip in the fabricating technology of package substrates.

Another object of the present invention is to provide a chip package structure having a flexible substrate specification.

Still another object of the present invention is to provide a method of fabricating a package substrate capable of relaxing the space limit of pitches between bumps on a chip in the fabricating technology of package substrates.

To achieve these and other advantages and in accordance with the purpose of the invention, as embodied and broadly described herein, the invention provides a package substrate for carrying a chip, and the chip has a plurality of bumps thereon. The package substrate comprises a first substrate, and an interposer. The first substrate has an opening and at least a first circuit layer disposed on a surface thereof. The interposer comprises a second substrate and a second circuit layer formed thereon. The interposer is disposed in the opening of the first substrate, and the second circuit layer has a plurality of bonding pads and traces. Each trace is electrically connected to one of the bonding pads. The bonding pads are used for being connected to the bumps on the chip. The second circuit layer of the interposer is physically and electrically connected to the first circuit layer of the first substrate, and the second substrate and the first substrate are made of different materials.

The present invention also provides a chip package structure comprising a package substrate, and a chip. The package substrate comprises a first substrate and an interposer. The first substrate has an opening and at least a first circuit layer disposed on a surface thereof. The interposer comprises a second substrate and a second circuit layer formed thereon. The interposer is disposed in the opening of the first substrate and the second circuit layer has a plurality of bonding pads and traces. Each trace is electrically connected to one of the bonding pads. The second circuit layer of the interposer is physically and electrically connected to the first circuit layer of the first substrate, and the second substrate and the first substrate are made of different materials. The chip is disposed on the interposer. The chip has a plurality of bumps connected to corresponding bonding pads on the interposer.

According to an embodiment of the present invention, at least one of the traces is disposed in the gap between two neighboring bonding pads.

According to an embodiment of the present invention, the first substrate further has a third substrate having a first circuit layer thereon and a dielectric layer disposed on the third substrate in the periphery of the interposer, and the first circuit layer is disposed on the dielectric layer.

According to an embodiment of the present invention, the dielectric layer further comprises a plurality of conductive vias such that the third circuit layer are electrically connected with the first circuit layer of the first substrate through the conductive vias.

According to an embodiment of the present invention, the chip package substrate further comprises an adhesion layer disposed between the second substrate of the interposer and the third substrate.

According to an embodiment of the present invention, the first substrate is a single-layer circuit board or a multi-layer circuit board.

According to an embodiment of the present invention, the interposer further comprises a passivation layer that covers the traces and the second substrate but exposes the bonding pads.

According to an embodiment of the present invention, the second substrate may be fabricated using silicon, glass, ceramics or polyimide.

According to an embodiment of the present invention, the chip package further comprises a solder mask layer that covers the third circuit layer and the dielectric layer but exposes the interposer.

According to an embodiment of the present invention, the interposer has a thickness between about 1 to 2 mil.

The present invention also provides a method of fabricating a chip substrate for carrying a chip with a plurality of bumps thereon. The method comprises the following steps. First, a first substrate and a second substrate are provided. The first substrate has at least a first circuit layer disposed on a surface thereof. Thereafter, a second circuit layer is formed on the second substrate so that the second circuit layer and the second substrate together constitute an interposer. The second circuit layer further comprises a plurality of pads and traces. Each trace is electrically connected to one of the bonding pads. Furthermore, the bonding pads are disposed in locations corresponding to the bumps on the chip. The interposer is disposed on the first substrate. After that, at least a dielectric layer is formed on the first substrate. The dielectric layer exposes the interposer. Then, a third circuit layer is formed over a portion of the dielectric layer. The third circuit layer is electrically connected with the second circuit layer of the interposer and the first circuit layer of the first substrate.

According to an embodiment of the present invention, the method of disposing the interposer on the first substrate comprises an adhering method.

According to an embodiment of the present invention, before disposing the interposer on the first substrate, the method further comprises forming a passivation layer over the second substrate to cover the traces and the second substrate but exposes the bonding pads.

According to an embodiment of the present invention, the method of fabricating the package substrate further comprises forming a plurality of conductive vias within the dielectric layer so that the third circuit layer is electrically connected to the first circuit layer of the first substrate through the conductive vias.

According to an embodiment of the present invention, the method of fabricating the package substrate further comprises forming a solder mask layer that covers the third circuit layer and the dielectric layer but exposes the interposer.

According to an embodiment of the present invention, at least one of the traces is disposed in the gap between two neighboring bonding pads.

According to an embodiment of the present invention, the method of forming the second circuit layer on the second substrate comprises depositing a metallic layer over the second substrate and then performing a photolithographic and an etching process to form the second circuit layer.

According to an embodiment of the present invention, the method of forming the dielectric layer and the third circuit layer comprises performing a build up process.

Accordingly, since the package substrate of the present invention utilizes an interposer for electrically connecting a first substrate and a chip together, the pitch of bumps on the chip is unaffected by the space limitation of the fabricating technology of the first substrate. Furthermore, because the package substrate connects with the chip through the interposer, and the interposer and the chip have similar thermal expansion coefficient, the flip chip device deploying the package substrate of the present invention have better bonding reliability. In addition, the interposer increases the heat-dissipating area of the chip. Hence, a flip chip device deploying the package substrate of the present invention can have a better thermal performance. Moreover, by modifying the circuit layout on the interposer, chips having different circuit layout can still use the package substrate of the present invention. Also, the chip location can be changed through a relocation of the interposer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2B is a top view of the interposer according to the first embodiment of the present invention.

DESCRIPTION OF THE EMBODIMENTS

Figure 1A:
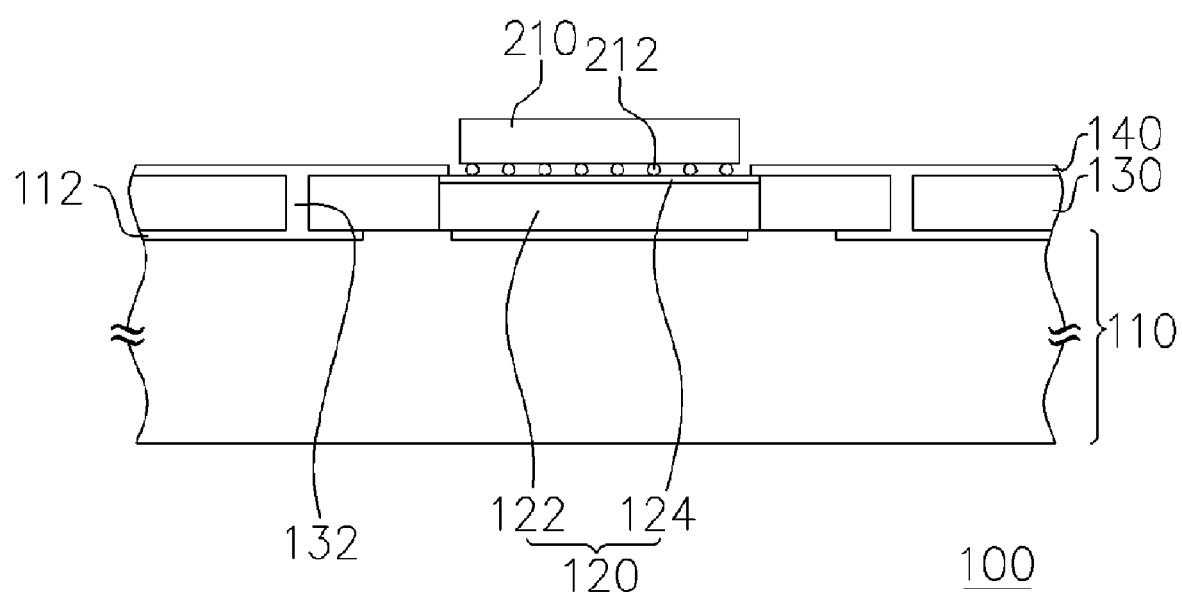
FIG. 1A is a schematic cross-sectional view showing the structure of a package substrate according to a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 1B:
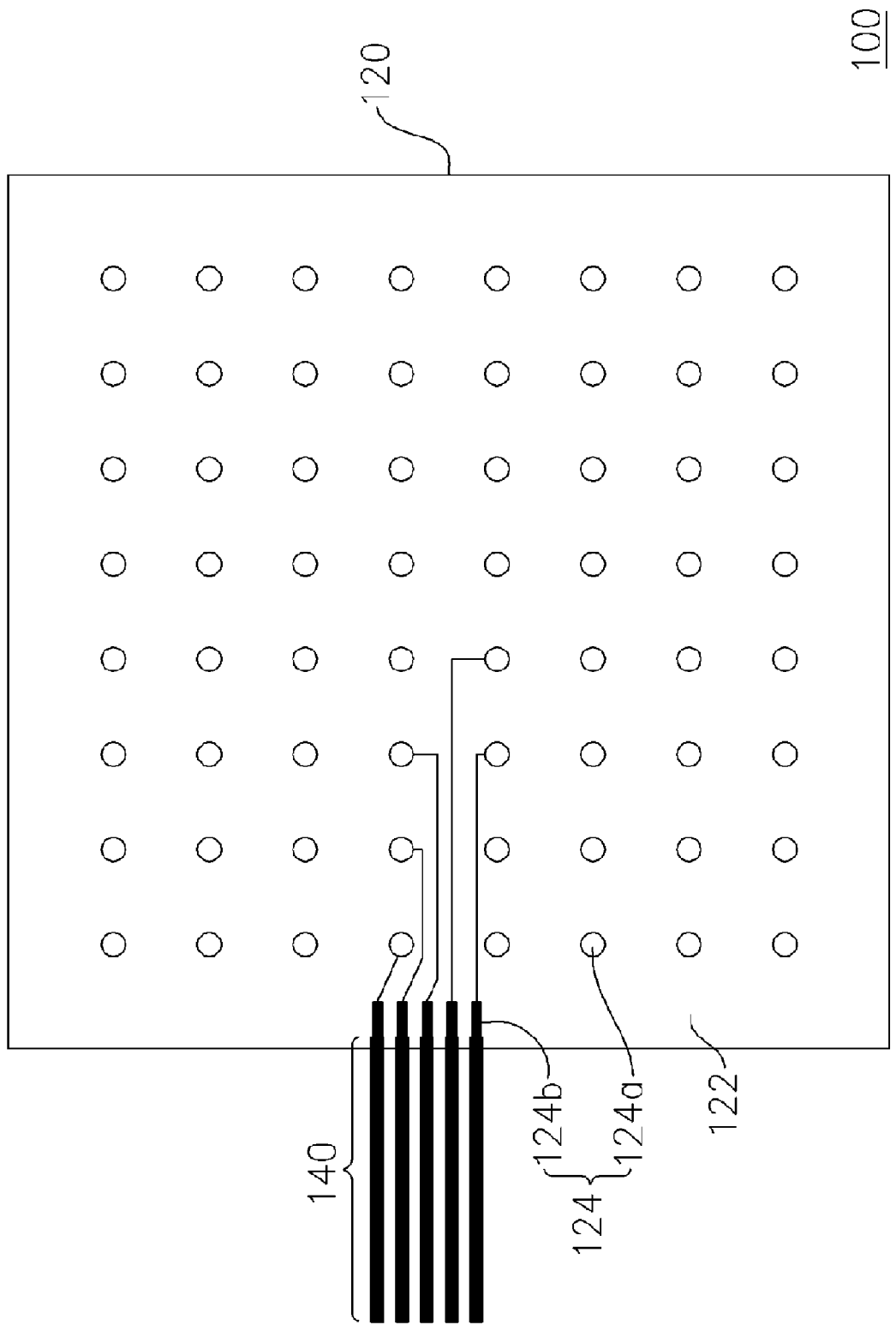
FIG. 1B is a top view of the package substrate according to the first embodiment of the present invention.

FIG. 1A is a schematic cross-sectional view showing the structure of a package substrate according to a first embodiment of the present invention. FIG. 1B is a top view of the package substrate according to the first embodiment of the present invention. As shown in FIGS. 1A and 1B, the package substrate 100 is designed to accommodate a chip 210 having a plurality of bumps 212 thereon. The package substrate 100 comprises a first substrate 110, an interposer 120, at least a dielectric layer 130 and at least a third circuit layer 140. The first substrate 110 has at least a first circuit layer 112 disposed on a surface thereof. In the present embodiment, the first substrate 110 doesn't be limited to a single-layer circuit board. The first substrate 110 may be a multi-layer circuit board.

The interposer 120 is disposed on the first substrate 110. The interposer 120 comprises a second substrate 122 and a second circuit layer 124. The second substrate 122 is disposed on the first substrate 110, and the second circuit layer 124 is disposed on the second substrate 122. Furthermore, the second circuit layer 124 has a plurality of bonding pads 124a and a plurality of traces 124b (as shown in FIG. 1B). Each trace 124b is electrically connected to one of the bonding pads 124a. The bonding pads 124a are disposed in locations corresponding to the bumps 212. Because the traces 124b extend to the edge of the second substrate 122, the bonding pads 124a can extend to the edge of the second substrate 122 through the traces 124b. In addition, the gap between two neighboring bonding pads 124a has at least a trace 124b passing through.

The dielectric layer 130 is disposed on the firs substrate 110 in the periphery of the interposer 120. The dielectric layer 130 is also connected with the interposer 120. In addition, the dielectric layer 130 further comprises a plurality of conductive vias 132. The conductive vias 132 are electrically connected to the first circuit layer 112 of the first substrate 110. The third circuit layer 140 is disposed on a portion of the dielectric layer 130. The third circuit layer 140 is electrically connected to the second circuit layer 124 of the interposer 120 and the first circuit layer 112 of the first substrate 110 through the conductive vias 132. The second circuit layer 124 is fabricated using gold, copper or other conductive materials. It should be noted that the chip 210 is disposed on the interposer 120, the bumps 212 on the chip 210 are electrically connected to corresponding bonding pads 124a and the third circuit layer 140 is electrically connected to the second circuit layer 124. Therefore, electrical signals from the chip 210 can be transmitted to the first circuit layer 112 of the first substrate 110 via the bumps 212, the bonding pads 124a, the traces 124b, the third circuit layer 140 and the conductive plugs 132. Moreover, the interposer has a thickness between about 1 to 2 mils so that the thickness of the first substrate 110 is close to the thickness of the package substrate 100. The structure of the interposer 120 is explained in more detail in the following.

Figure 2A:
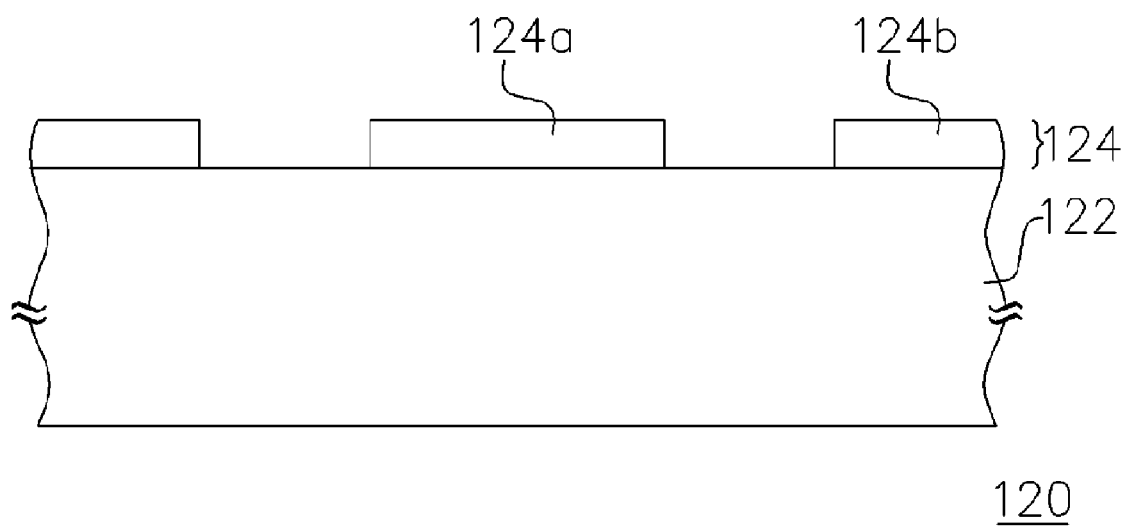
FIG. 2A is a schematic cross-sectional view showing the structure of an interposer according to the first embodiment of the present invention.

FIG. 2A is a schematic cross-sectional view showing the structure of an interposer according to the first embodiment of the present invention. FIG. 2B is a top view of the interposer according to the first embodiment of the present invention. As shown in FIGS. 2A and 2B, the interposer 120 mainly comprises a second substrate 122 and a second circuit layer 124. The second substrate 122 is fabricated using silicon, glass, ceramics, polyimide or other materials having a coefficient of thermal expansion (CTE) between that of the chip 210 and the first substrate 110. It should be noted that the circuit layout of the bonding pads 124a and the traces 124b is not restricted to the one shown in FIG. 2B. In fact, the circuit layout can be designed according to the actual requirements.

Figure 2C:
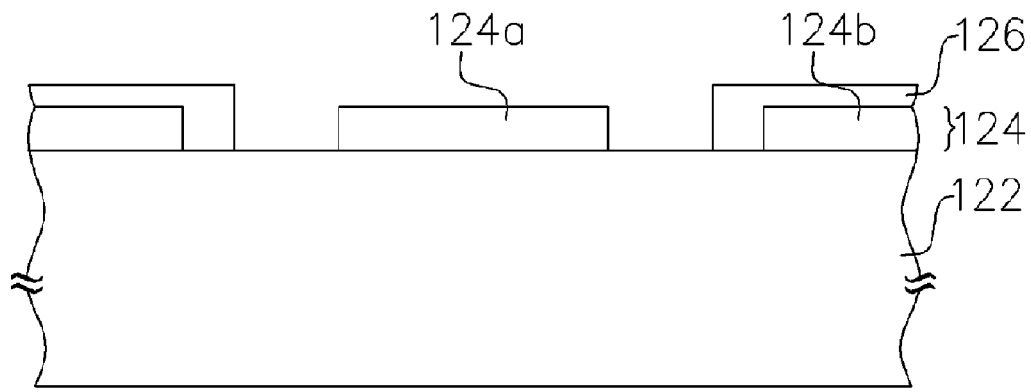
FIG. 2C is a schematic cross-sectional view of the interposer according to the first embodiment of the present invention.

FIG. 2C is a schematic cross-sectional view of the interposer according to the first embodiment of the present invention. To protect the traces 124b of the second circuit layer 124, a passivation layer 126 is formed over the interposer 120 to cover the traces 124b and the second substrate 122 but exposes the bonding pads 124a. The passivation layer 126 protects the traces 124b by minimizing the environmental impact (such as moisture or dust) on the traces 124b. However, a passivation layer over the interposer 120 is non-essential in the present invention.

Since the chip 210 is electrically connected to the first circuit layer 112 of the first substrate 110 through the interposer 120, the precision in the fabricating process of the first substrate 110 is not constrained by the bump pitch of the chip 210. In other words, a circuit board having a lower fabricating precision can be used as the first substrate 110. Thus, the fabrication process is much simplified and the cost of producing the chip package substrate is greatly reduced. Furthermore, a low-precision first substrate 110 equipped with high-precision interposer 120 in partial area is enough to carry a fine pitch chip 210. That means a fine pitch chip 210 no longer requires a costly, fine pitch substrate. Furthermore, the circuit layout inside the interposer 120 can be easily modified to match different types of chips 210 so that the range of applications of the package substrate 100 can be increased.

The interposer 120 has a coefficient of thermal expansion (CTE) between that of the chip 210 and the first substrate 110. Therefore, the interposer 120 can minimize the stress and warpage due to a mismatch in the coefficient of thermal expansion (CTE) between the chip 210 and the first substrate 110. Consequently, the package substrate 100 of the present invention can provide the flip chip device with greater reliability. Another advantage of the package substrate 100 is that the chip 210 can increase its heat-dissipating area through the interposer 120. Ultimately, a flip chip device deploying the package substrate 100 of the present invention can have a higher thermal performance. The fabricating method of the package substrate 100 is discussed in the following.

Referred to FIGS. 2A and 2B, the process of fabricating a package substrate 100 comprises the following steps. First, an interposer 120 is formed. The steps for forming the interposer 120 include providing a second substrate 122 and then forming a conductive layer (not shown) over the second substrate 122. The conductive layer is made of gold, copper or other conductive materials formed, for example, by performing an evaporation process, a sputtering process or other electroplating process. Thereafter, the conductive layer is patterned to form a second circuit layer 124 over the second substrate 122. The patterning process includes performing a photolithographic process followed by an etching process, for example.

As shown in FIGS. 1A and 1B, a substrate 110 is provided. An interposer 120 is disposed on the substrate 110. Thereafter, a dielectric layer 130 is formed on the first substrate 110. The dielectric layer 130 exposes the interposer 120. A photolithographic and etching process is carried out on the dielectric layer 130 to form a plurality of via holes (not shown). After that, a metallic layer (not shown) is formed on a portion of the dielectric layer 130. The metallic layer fills the vias to form conductive vias 132. Then, another photolithographic and etching process is carried out on the metallic layer to form a third circuit layer 140. In addition, the method of forming the dielectric layer 130 and the third circuit layer 140 may be a build-up process. It should be noted that the present also includes other methods of electrically connecting the third circuit layer 140 with the first circuit layer 112 of the first substrate 110 other than the conductive vias 132.

Second Embodiment

Figure 3:
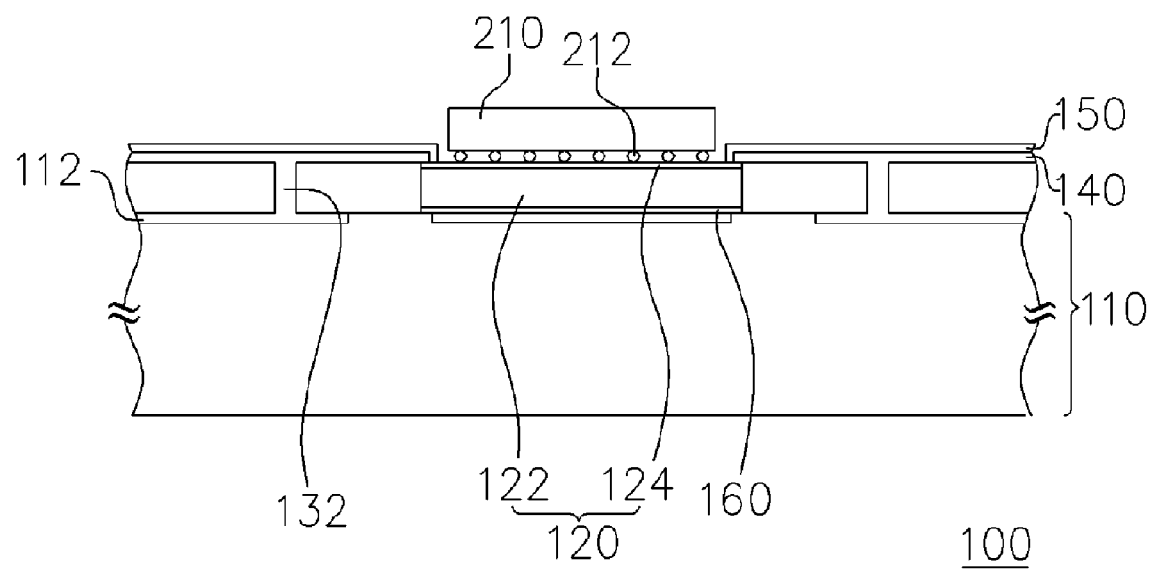
FIG. 3 is a schematic cross-sectional view showing the structure of a package structure according to a second embodiment of the present invention.

FIG. 3 is a schematic cross-sectional view showing the structure of a package structure according to a second embodiment of the present invention. In the second embodiment, the components same as those in the first embodiment are labeled with identical marks without further description.

The package substrate 100 as shown in FIG. 3 further comprises a solder mask layer 150 and an adhesion layer 160. The solder mask layer 150 covers the third circuit layer 140 and the dielectric layer 130 but exposes the interposer 120. The adhesion layer 160 is disposed between the interposer 120 and the first substrate 110. The interposer 120 is adhered to the first substrate 110 through an adhesion layer 160. Furthermore, the interposer 120 and the first substrate 110 can be connected together using other method beside the adhesion layer 160. In addition, there is no restriction on the method of electrically connecting the chip 210 to the interposer 120. Beside bumps 212, the chip 210 can be electrically connected to the interposer 120 through anisotropic conductive paste (ACP), anisotropic conductive film (ACF) or other similar material.

However, the dielectric layer 130 and first substrate 110 described above can be integrated to a single substrate, and the single substrate has an opening for receiving the interposer 120.

In summary, the chip package structure, package substrate and manufacturing method thereof of the present invention have at least the following advantages.

1. The package substrate of the present invention uses an interposer fabricated using a technique similar to the chip.

Since the pitch of bumps on the chip is no longer affected by the actual fabricating technology of the circuit board, the chip can have higher bump density.

2. The chip and the interposer have very similar coefficient of thermal expansion so that stress between the chip and the interposer is reduced. Therefore, the warpage of the package substrate inside a flip chip device is minimized and the reliability of connection between the chip and the interposer is improved.

3. The interposer provides an additional pathway for dissipating heat away from the chip. Thus, the chip package and the package substrate of the present invention have better thermal performance.

4. The chip package substrate and fabricating method thereof of the present invention has a wide range of applications because the circuit layout of the interposer can be readily modified to correspond with any type of chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a package substrate comprising:
      a first substrate having at least a first circuit layer disposed on a surface thereof;
      at least a dielectric layer disposed on the first substrate and covering the first circuit layer, wherein the dielectric layer has an opening exposing the first substrate;
      a third circuit layer formed on an upper surface of the dielectric layer,
      an interposer comprising a second substrate and a second circuit layer formed on an upper surface of the second substrate, wherein the interposer is disposed in the opening of the dielectric layer and on the exposed first substrate, the second circuit layer further comprises a plurality of bonding pads, and a plurality of traces such that each trace is electrically connected to one of the bonding pads, wherein the second circuit layer of the interposer is physically and electrically connected to the third circuit layer, the third circuit layer is electrically connected to the first circuit layer of the first substrate and the second substrate and the first substrate are made of different materials; and
   a chip having a plurality of bumps thereon, disposed on the interposer such that the bumps are connected to corresponding bonding pads of the second circuit layer.

2. The chip package structure of claim 1, wherein at least one of the traces is disposed between two neighboring bonding pads.

3. The chip package structure of claim 1, wherein the dielectric layer further comprises a plurality of conductive vias through which the third circuit layer and the first circuit layer of the first substrate are electrically connected.

4. The chip package structure of claim 1, wherein the package substrate further comprises an adhesion layer disposed between the second substrate of the interposer and the first substrate.

5. The chip package structure of claim 1, wherein the first substrate has a coefficient of thermal expansion different to that of the second substrate.

6. The chip package structure of claim 1, wherein the interposer further comprises a passivation layer that covers the traces and the second substrate but exposes the bonding pads.

7. The chip package structure of claim 1, wherein the package further comprises a solder mask layer that covers the third circuit layer and the dielectric layer but exposes the interposer.

8. The chip package structure of claim 1, wherein the first substrate is a single-layer circuit board or a multi-layer circuit board.

9. The chip package structure of claim 1, wherein the interposer has a thickness between about 1 to 2 mil.

* * * * *